US009145303B2

(12) United States Patent
Goncharov et al.

(10) Patent No.: US 9,145,303 B2
(45) Date of Patent: Sep. 29, 2015

(54) CHEMICAL VAPOR DEPOSITION REACTOR HAVING CERAMIC LINING FOR PRODUCTION OF POLYSILICON

(71) Applicant: Ecolive Technologies LTD., London (GB)

(72) Inventors: Anatoly Alexandrovich Goncharov, Moscow (RU); Yury Dmitrievich Kalashnikov, Moscow (RU)

(73) Assignee: ECOLIVE TECHNOLOGIES LTD., London (GB)

( * ) Notice: Subject to any disclaimer, the term of this patent is extended or adjusted under 35 U.S.C. 154(b) by 0 days.

(21) Appl. No.: 13/768,938

(22) Filed: Feb. 15, 2013

(65) Prior Publication Data

US 2014/0235041 A1   Aug. 21, 2014

(51) Int. Cl.
| | |
|---|---|
| *C23C 16/00* | (2006.01) |
| *C01B 33/035* | (2006.01) |
| *H01L 21/02* | (2006.01) |

(52) U.S. Cl.
CPC ........... *C01B 33/035* (2013.01); *H01L 21/0262* (2013.01)

(58) Field of Classification Search
CPC .................... C23C 16/4404; C23C 16/455
USPC ............................. 438/488, 680, 164; 118/715
See application file for complete search history.

(56) References Cited

U.S. PATENT DOCUMENTS

| | | | | |
|---|---|---|---|---|
| 5,275,976 A | * | 1/1994 | Moslehi .................... 438/800 |
| 5,585,173 A | * | 12/1996 | Kamo et al. ............... 428/304.4 |
| 6,148,832 A | * | 11/2000 | Gilmer et al. ............. 134/166 R |
| 6,381,986 B1 | * | 5/2002 | Loxley et al. ................. 65/17.5 |
| 8,399,072 B2 | * | 3/2013 | Revankar et al. ............. 427/588 |
| 2006/0264051 A1 | * | 11/2006 | Thibaut .......................... 438/690 |
| 2012/0304931 A1 | * | 12/2012 | Bagatur et al. ................. 118/715 |
| 2013/0052371 A1 | * | 2/2013 | Higashi et al. ................. 427/585 |

OTHER PUBLICATIONS

Jianlong et al., Technical Challenges and Progress in Fluidized Bed Chemical Vapor Deposition of Polysilicon, 2011, Chinese Journal of Chemical Engineering, 19(5) 747-753 (2011).*
Singh et al., LPCVD of Polysilicon, 2005, Oxfords Instruments Plasma Technology, pp. 1-7, May 2005.*
Excerpts from The Great Soviet Encyclopedia (1979).*

* cited by examiner

*Primary Examiner* — Reema Patel
*Assistant Examiner* — Syed Gheyas
(74) *Attorney, Agent, or Firm* — Baker Botts L.L.P.

(57) ABSTRACT

Apparatus configured to produce polysilicon by chemical vapor deposition, including a reactor vessel having an inner surface defining at least a portion of a chamber, the inner surface having a lining of quartz ceramic. The apparatus also includes a silicon substrate disposed within the chamber of the reactor vessel, the silicon substrate having a deposition surface upon which polysilicon is deposited. Methods of producing polysilicon using such apparatus, as well as methods for applying the quartz ceramic lining onto a reactor vessel, are also provided.

27 Claims, 4 Drawing Sheets

| Parameters/ Conditions | Example 1 | Comparative Example 1 (no ceramic lining) | Example 2 | Comparative Example 2 (no ceramic lining) |
|---|---|---|---|---|
| Diameter of reactor vessel (mm) | 1800 | 1800 | 1800 | 1800 |
| Thickness of ceramic lining (mm) | 30 | n/a | 30 | n/a |
| Number of silicon rods | 36 | 36 | 36 | 36 |
| Height of each rod (mm) | 2000 | 2000 | 2000 | 2000 |
| Total power consumption of the silicon rods (kW) | 1550 | 2555 | 1850 | 3195 |
| Operating pressure (Pa) | 500000 | 500000 | 500000 | 500000 |
| Working gases flow rate (kg/h) | 1357 | 1357 | 1357 | 1357 |
| Diameter of silicon rods (mm) | 120 | 120 | 150 | 150 |
| Working gas temperature at inlet (°C) | 150 | 150 | 150 | 150 |
| Temperature of reactor jacket (°C) | 100 | 100 | 100 | 100 |
| Temperature of silicon rods (°C) | Surface temperature can be 950°C-1050°C depending on rod locations; Can reach 1260°C for the center of some rods. | Surface temperature can be 1050°C-1200°C depending on rod locations; Can reach 1270°C for the center of some rods. | Surface temperature can be 1000°C-1200°C depending on rod locations; Can reach 1260°C for the center of some rods. | Surface temperature can reach 1000°C-1300°C depending on rod locations. Can reach 1430°C for the center of some rods which exceeds the melting point of polysilicon. |
| Average temperature of working gases inside reactor (°C) | ~600 | ~675 | ~750 | ~800 |
| Temperature gradient of the ceramic lining (°C) | 300-600 | n/a | 400-700 | n/a |

FIG. 4

CHEMICAL VAPOR DEPOSITION REACTOR HAVING CERAMIC LINING FOR PRODUCTION OF POLYSILICON

TECHNICAL FIELD

The disclosed subject matter generally relates to manufacture of polycrystalline silicon. More specifically, the disclosed subject matter relates to methods for improving operation and energy efficiency of existing chemical vapor deposition (CVD) reactors for the production of polycrystalline silicon.

BACKGROUND

Polycrystalline silicon (polysilicon, poly-Si, or simply "poly") has been a key material in the semiconductor and solar industries. It has been generally produced by a thermal decomposition and deposition process. For example, the "Siemens C-process" or "Siemens Method," developed in the early 1950s, currently produces the majority of the polysilicon in the world. In the process, a chemical vapor deposition (CVD) reactor can be used with trichlorosilane (TCS, chemical formula $SiHCl_3$) and hydrogen as reactant gases (working gases). At a suitable temperature, the reaction of the reactant gases occurs and produces polysilicon, which is deposited on high-purity thin silicon rods ("slim rods") provided in the CVD reactor.

Energy consumption of the CVD process for manufacturing polysilicon is significant due to the high temperature required for the process. The silicon rods are typically heated by resistive heating by electricity. However, the efficiency of the resistive heating can be low because much of the heat generated is dissipated in the CVD reactor, with the exiting gases, and through the reactor wall. For example, the production of 1 kg of polysilicon using existing CVD reactors can require as high as 75 kWh. In addition, the deposition of silicon on the silicon rods is limited because as the silicon rods grow in dimension, the core of the rods are at a higher temperature so that the temperature at the deposition surface of the rods is sufficient for the thermal reduction of silicon. As polysilicon can melt at about 1410° C., excessive heating of silicon rods having large cross dimension can create an avalanche which causes demolition of the rods and interruption of the manufacturing process. Thus, when the diameter of the silicon rods grow to about 120 mm, the manufacturing operation is stopped and the silicon rods harvested.

To reduce radiation loss of heat in the process, it has been proposed that the internal surface of the reactors be coated with gold or silver. However, the coating of internal walls of reactor is highly technically difficult, expensive, and inconvenient as the reactor need be dismounted and delivered to the reactor manufacturer's site. Further, deposition of Si containing films on the gold or silver surface can impair the reflection properties of the gold or silver coating. Cleaning and drying operation can be time consuming, and can lower the quality of gold coating as well as result in decreased productivity of reactor.

In certain CVD reactor design, a quartz bell jar is used inside the reactor, and silicon rods are house inside the jar. Such a quartz jar typically has thin wall, through which IR radiation can easily pass. As such, additional heating can be provided to the CVD process from a heat source outside of the jar. Quartz jar having greater thickness is difficult to construct especially for commercial size CVD reactors.

Hence, there is a need to improve the existing CVD reactors to provide higher energy efficiency and productivity for the production of polysilicon.

SUMMARY

The purpose and advantages of the disclosed subject matter will be set forth in and apparent from the description that follows, as well as will be learned by practice of the disclosed subject matter. Additional advantages of the disclosed subject matter will be realized and attained by the methods and systems particularly pointed out in the written description and claims hereof, as well as from the appended drawings.

To achieve these and other advantages and in accordance with the purpose of the disclosed subject matter, as embodied and broadly described, the disclosed subject matter includes an apparatus configured to produce polysilicon by chemical vapor deposition. The apparatus includes a reactor vessel having an inner surface defining at least a portion of a chamber, the inner surface having a lining of quartz ceramic; and a silicon substrate disposed within the chamber of the reactor vessel, the silicon substrate having a deposition surface upon which polysilicon is deposited. In some embodiments, the reactor vessel can have an overall cross dimension of from about 1000 to about 5000 mm. In some embodiments, the lining of the quartz ceramic has a thickness of about 10 mm to 60 mm, e.g., about 30 mm to about 50 mm, or about 40 mm to about 60 mm. In some embodiments, the lining of the quartz ceramic has a thickness selected to maintain a temperature of the inner surface of the reactor within the range of between about 600° C. and about 900° C. during operation of the reactor vessel for production of polysilicon by chemical vapor deposition.

The lining can include quartz particles having an average diameter of from about 50 nanometers to about 300 micrometers, and/or quartz particles having a purity of $SiO_2$ of about 99.99% or greater, and/or having a porosity of from about 1% to about 90%. The lining can include amorphous silica, crystalline silica, and mixtures thereof. The lining can also include fused crushed $SiO_2$ or spheroidized microgranules $SiO_2$. In some embodiments, the lining is defined by sections or panels. In other embodiments, the lining is a coating formed in situ.

In some embodiments, the silicon substrate includes one or more silicon rods. The silicon rods can have an initial cross-sectional dimension of from about 5 mm to about 15 mm. The silicon rods can have round, rectangular, or other cross-sectional shape. During the CVD process, the silicon rods can grow to a cross-sectional dimension of about 120 mm to about 150 mm.

In another aspect, the disclosed subject matter provides a method of producing polysilicon using a reactor vessel having an inner surface defining at least a portion of a chamber, and a silicon substrate disposed within the chamber. The method includes applying a lining of quartz ceramic to the inner surface of the reactor vessel; and introducing at least one reactant gas for chemical vapor deposition into the reactor vessel to contact the silicon substrate at a suitable reaction temperature to produce polysilicon.

In some embodiments, the silicon substrate, such as a silicon rod, can be heated to a suitable reaction temperature, e.g., about 1000° C. to about 1100° C. The deposited polysilicon can grow on the silicon rod to form a rod having a diameter of about 120 mm to about 150 mm. In certain embodiments, the temperature of the internal surface of the reactor vessel can be maintained at about 600° C. to 900° C. In some embodiments, the reactant gases can include silane or a chloro-substituted silane, for example, trichlorosilane.

In a further aspect, the disclosed subject matter discloses a method of improving an existing reactor vessel configured for the production of polysilicon by chemical vapor deposition. The method includes applying a lining of quartz ceramic to the inner surface of the reactor vessel (which originally can be made of a metal, such as stainless steel). In some embodiments, applying the quartz ceramic lining can include forming one or more sections of the lining, and attaching the one or more sections of the lining to the inner surface of the reactor vessel. In certain embodiments, forming the lining can include obtaining raw quartz particles, milling the raw quartz particles, forming an aqueous slip of the milled quartz particles, and molding the slip of the milled quartz particles into sections or panels (which can be subsequently dried, sintered, and annealed). In other embodiments, attaching the sections or the panels of the lining can include using one or more latch elements or glue. In alternative embodiments, applying the lining can include coating the lining in situ on the inner surface of the reactor vessel, e.g., using a plasma sputtering device.

BRIEF DESCRIPTION OF THE DRAWINGS

FIG. 4 is a table including testing parameters and results for selected examples for the polysilicon production using the disclosed apparatus and system having a quartz ceramic lining according to the disclosed subject matter as compared with data obtained with the apparatus and system having no such lining.

It is to be understood that both the foregoing general description and the following detailed description are exemplary and are intended to provide further explanation of the disclosed subject matter claimed.

The accompanying drawings, which are incorporated in and constitute part of this specification, are included to illustrate and provide a further understanding of the disclosed subject matter. Together with the description, the drawings serve to explain the principles of the disclosed subject matter.

DETAILED DESCRIPTION

Reference will now be made in detail to the various aspects of the disclosed subject matter, exemplary embodiments of which are illustrated in the accompanying drawings.

In one aspect, the disclosed subject matter provides an apparatus configured to produce polysilicon by chemical vapor deposition. The apparatus includes a reactor vessel having an inner surface defining at least a portion of a chamber, the inner surface having a ceramic lining. A silicon substrate is disposed within the chamber of the reactor vessel. The silicon substrate has a deposition surface upon which polysilicon is deposited.

Figure 1:
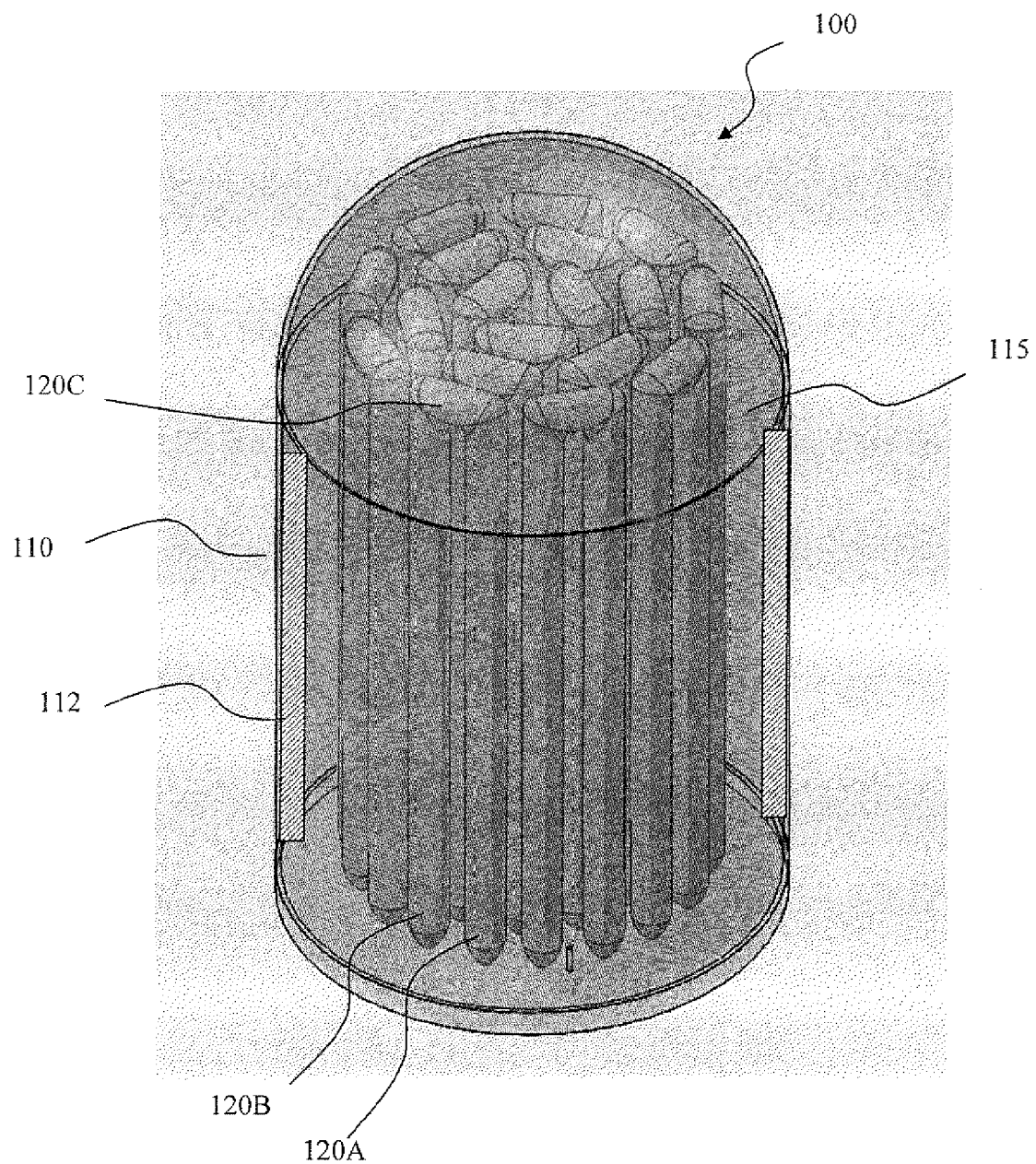
FIG. 1 is a schematic representation of an apparatus for production of polysilicon having a quartz ceramic lining according to a representative embodiment of the disclosed subject matter.

For illustration and not limitation, FIG. 1 depicts a schematic representation of an apparatus of the disclosed subject matter. The apparatus 100 includes a reactor vessel 110 defining a chamber 115. The reactor vessel can be a commercial CVD reactor vessel for polysilicon production, which can have an overall cross dimension of from about 1000 to about 5000 mm. A deposition substrate can include a plurality of silicon rods (e.g., 36 rods as shown in FIG. 1), upon which silicon formed from the reactant gas(es) can be deposited. The plurality of silicon rods can be arranged along multiple rings, with each two adjacent rods 120A and 120B bridged from the top by a cross rod 120C to form part of a closed circuit for resistive heating. In operation, the silicon rods can be pre-heated to a temperature suitable for the production of polysilicon by chemical vapor deposition, for example, from about 1000 to about 1200° C. (surface temperature). Before the CVD process, the silicon rods can each have a cross-sectional dimension of from about 5 mm to about 15 mm. Over the course of the CVD process, the dimension of the silicon rods can reach about 150 mm.

The reactor vessel 10 has an internal surface applied with a ceramic lining 112. Although only shown to be applied to a side wall of the reactor vessel 110, the ceramic lining can also be applied to other portions of the reactor vessel, for example, the top portion (shown as a dome in FIG. 1), if desired. Due to its smooth surface, structural robustness, chemical inertness in the aggressive atmosphere in the CVD reactor, and excellent reflection and heat insulation properties, the ceramic lining 112 can significantly improve the operation efficiency of the CVD process as compared to an apparatus without such lining. The thickness of the ceramic lining can be selected to maintain a temperature of the inner surface of the reactor (i.e., the innermost surface of the lining) within the range of between about 600° C. and about 900° C., while the outmost portion of the lining (i.e., the portion nearest the original reactor wall) maintains a temperature of as low as 400° C., or even as low as 300° C. or lower during operation of the reactor vessel for production of polysilicon by chemical vapor deposition. In a CVD reactor having such a quartz ceramic lining, the temperature difference between the core of the deposition rods and the surface of the rods can be reduced, therefore allowing the manufacturing process to continue further to obtain silicon rods of larger dimensions.

The suitable thickness of the quartz ceramic lining can depend on the dimension (and other structural characteristics) of the reactor vessel, the construction material of the reactor vessel, the power consumption levels (including the operating temperature of the silicon rods), as well as other CVD process conditions such as the flow rate of the reactant gas(es) (and carrier gas, if any). Additional considerations in determining the suitable thickness include the thermal conductivity of the quartz ceramics (e.g., composition of quartz fraction, crystal structure, and density of the ceramics). Thus, a suitable thickness can be determined individually taking into account of these considerations. For example, such a determination can be made by performing computer simulation using Solid-Works® FlowWorks® 2010. In some embodiments, the ceramic lining can have a thickness of up to 100 mm, e.g., about 10 to 60 mm, or 20 to 50 mm.

The ceramic lining can include amorphous silica, crystalline silica, or the mixtures thereof. For example, the ceramic lining can include quartz particles having an average diameter of from about 50 nanometers to about 300 micrometers, and a porosity of from about 1% to about 90%. The quartz particles in the lining can have a purity of $SiO_2$ of about 99.99% or greater. The ceramic lining can also include fused crushed $SiO_2$ or spheroidized microgranules $SiO_2$. The ceramic lining can include both porous and monolithic layers.

The ceramic lining can be manufactured in various ways. In some embodiments, the ceramic lining can be pre-fabricated and then installed on the inner surface of the reactor vessel (the original inner surface of the reactor vessel can be stainless steel). In such embodiments, the ceramic lining can be manufactured into sections or panels. The manufacturing procedure can use colloidal processing, which includes milling of raw amorphous or crystalline quartz ($SiO_2$ purity 99% or greater) down to fractions having 0.01-100 micrometers in diameter, and forming an aqueous slip of the milled quartz particles (i.e., dispersing of quartz particles into a colloidal solution. The slip of milled quartz particles can be molded into sections or panels, which can then be dried, sintered, and annealed. The prepared sections or panels can be machined, e.g., polished, and/or further structurally modified to introduce latch elements or other features to facilitate their installation into the CVD reactors. In such a manner, the sections or panels of the lining can be manufactured off-site and delivered to the site of installation. The quartz ceramic panels can be installed on the inner surface of the reactor wall with latch elements on the panels and/or on silicate glue on a launching start-plate basis, as will be further described below.

Figure 2:
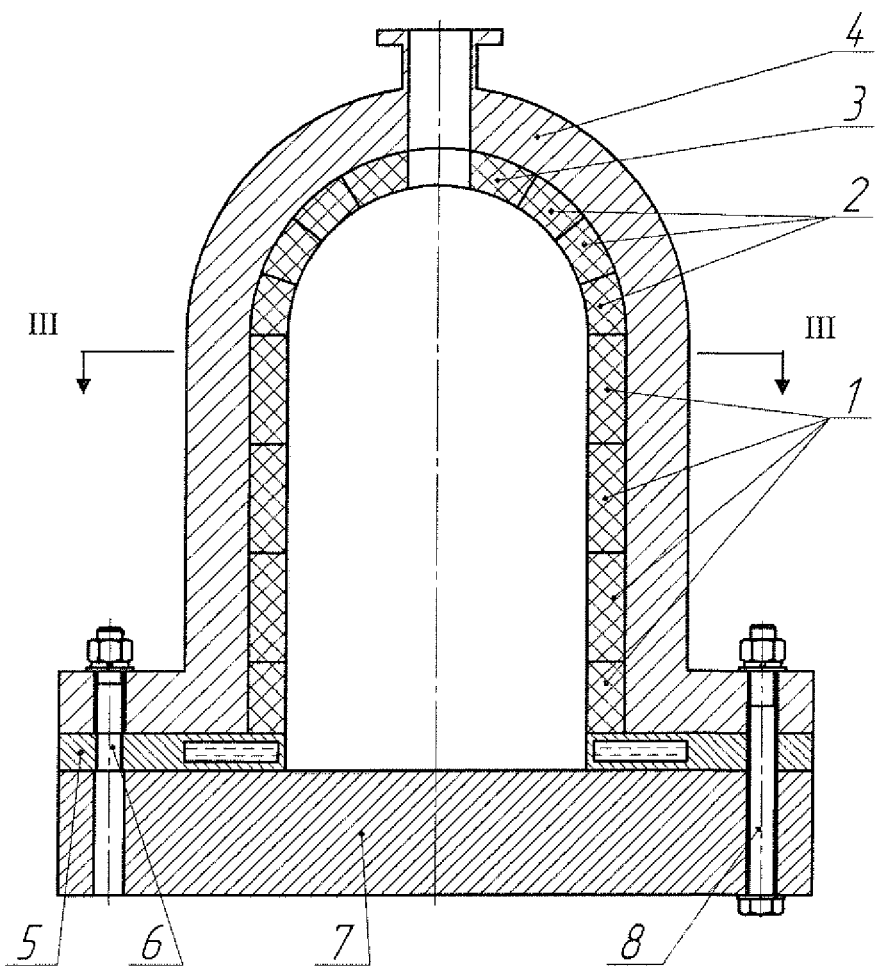
FIG. 2 is another schematic representation of an apparatus for production of polysilicon having a quartz ceramic lining according to a representative embodiment of the disclosed subject matter.

For purpose of illustration and not limitation, and referring to FIG. 2, an exemplary process of installing sections of a quartz ceramic lining on an existing reactor vessel is described below. The plate-start basis 5 can be first set on the plate-start base 7 of the reactor vessel. Sections of quartz ceramic lining 1, 2, 3 can also be disposed or set on the water-cooled plate-start basis 5. To provide constructive rigidity of these sections, the connection of the sections can be secured with the aid of bonding with an adhesive (e.g., a silica-based adhesive) and/or a quartz tape. Next, the cap portion 4 of the reactor vessel can be installed using hoisting gear and predetermined removable guides in the plate-start base 7. The plate-start basis 5 and cap portion 4 of the reactor vessel can be fastened together by a threaded connection 6 to the base 7 (a complete bolted connection is shown as 8).

The procedure described above allows for removal of polysilicon from the reactor without disassembly of the quartz lining, as the cap 4, the sections of the quartz lining 1, 2, 3 and the plate-start basis 5 can be lifted together as one assembled piece at the end of a silicon-deposition growth batch process.

Figure 3A:
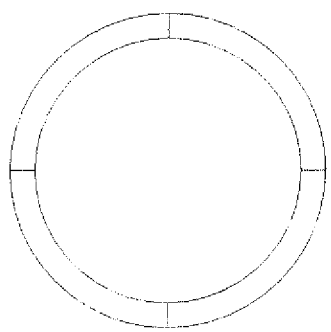
FIGS. 3a and 3b are cross-sectional diagrams of sections of quartz ceramic lining as assembled according to some embodiments of the disclosed subject matter.
Figure 3B:
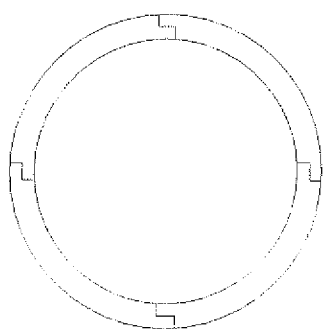

In addition or as an alternative to the use of adhesives or the like to secure the sections of the ceramic lining to the vessel, a mechanical interlocking arrangement can be provided. For example, the sections of ceramic lining can be provided with suitable thickness to form an abutting interface as shown in FIG. 3a, and/or with latch elements along edges to form an interlocking arrangement as shown in FIG. 3b. Any number of the sections in the circumferential direction can be provided, such as four and more, and the dimensions can be selected based on the thickness of the quartz ceramic lining sections and/or and their strength.

Alternatively, the ceramic lining can be manufactured in-situ, i.e., directly applied onto an internal surface of an existing CVD reactor vessel. In some embodiments, such a method includes using a plasma sputtering device. For example, raw amorphous or crystalline quartz ($SiO_2$ purity 99% or greater) can be first milled to obtain fractions having 0.01-100 micrometers in diameter. Desired size fractions (for example <5 µm, 5-30 µm and 30-100 µm) can be selected based on the desired end qualities of ceramics, for example, density, thermal conductivity, etc. and fed into plasma sputtering device, and plasma coated on the inner surface of the wall of the reactor. This in situ method of applying the ceramic lining using plasma sputtering does not require additional mechanical fastening to the reactor, because during plasma sputtering good adhesion of the quartz ceramic to metal reactor can be obtained, which allows the lining to form a self-supporting monolithic construction. Such plasma sputtering can include multiple passes, e.g., a few dozen passes, to reach desired thickness (as one pass can coat a layer of quartz ceramic with a limited thickness, e.g., about 0.3-1 mm).

The reactor vessel having the installed ceramic lining as discussed above can be used to produce polysilicon. As noted previously, the general process for the production of polysilicon uses a thermal reduction of a silicon containing composition. For example, silane or chlorosilanes can be used in the silicon containing composition. A carrier gas for such a process can be hydrogen, or an inert gas. When TCS (trichlorosilane) is used as a reactant gas, hydrogen also participates in the reaction according to the chemical reaction: $SiHCl_3 + H_2 = Si + 3HCl$. Such reaction can occur at a temperature in the range of 1000° C. to 1200° C. or 1000° C. to 1100° C., depending on the actual composition and process details. The gaseous byproducts of the CVD process reactor can be removed continuously through outlet ports of the reactor, as reactant gases are introduced through inlet ports (e.g., peripheral holes on the reactor) into the reactor. For TCS and $H_2$, they can be first mixed in pipes and then are fed into the CVD reactor through a nozzle.

TCS can be obtained by hydrochlorination of Si, which involves Si reacting with anhydrous HCl and $H_2$ to produce a mix of TCS and silicon tetrachloride. The mix can be condensed and TCS separated from silicon tetrachloride by distillation. Before being introduced into a CVD reactor, the TCS can be purified. $H_2$ required for the CVD reaction can be provided from an external source, or generated on-site to compensate for hydrogen usage and losses during production. The off-gas which may contain hydrogen, hydrochloric acid, and chlorosilanes can be separated, scrubbed, and/or recycled to the reactor or other related processes for the CVD process as appropriate.

The polysilicon production can be a batch process, which starts with initial silicon rods which are slim in cross dimension and finishes with high purity polysilicon rods. The initial silicon rods for polysilicon deposition in the CVD process can be prepared by pulling a Si-rod with a FZ (float zone) machine, or by cutting a longer Si-rod with a cutting machine. At the end of the batch, the polysilicon rods can be removed from the reactor vessel, and then crushed and transformed into "chunks" or "nuggets" more suitable for downstream processes. The applied lining does not cleaning after each manufacturing batch.

The initial and growing silicon rods can be heated electrically by an external power supply. As previously noted, for reactant gases including TCS and $H_2$, the suitable temperature for the deposition of Si on the rods can be about 1000 to 1200° C. The core of the silicon rods will be at higher temperatures because the surface of the rods are cooled by the lower temperature reactant gases. The deposited polysilicon grows on the silicon rods to form final rods having a diameter of about 120 mm to about 150 mm, depending on desired or available power consumption level, reactor vessel size, and other operating conditions. Note that the increase of the capacity to manufacture 150 mm rods according to the disclosed subject matter represent about 25% increase in productivity as compared to existing technology which can only manufacture silicon rods up to about 120 mm. The innermost surface temperature of the lining can be same as the temperature of the working gases in the reactor vessel, e.g., about 600° C. to 900° C. The outmost portion of the lining can have a temperature of as low as 400° C., or even as low as 300° C. or lower.

For illustration and not limitation, in one example of the disclosed subject matter, a CVD reactor for manufacturing polysilicon has a diameter of about 1800 mm, with a quartz ceramic lining having a thickness of about 30 mm applied on the inner surface of the side reactor wall. The density of the quartz ceramic lining can be about from 500 to 2050 kg/m$^3$, the thermal conductivity coefficient of the quartz ceramic lining can be about from 0.2 to 1.6 W/m*K, the thermal capacity coefficient of the quartz ceramic lining is about 1200 J/kg*K, and the melting point of the quartz ceramic lining is about 1600° C. 36 silicon rods are placed in the reactor chamber, and the height of each rod is about 2500 mm. Working gases flow rate is about 1357 kg/h, and the working temperature on the surface of the silicon rods is about 1050-1350° C., with an inner temperature of the rods up to about 1430° C. The temperature of the reactor jacket is about 80 to about 100° C. Maximum power consumption is about 1550 kW with final rods diameter of about 120 mm (compared with about 2500 kW with rods diameter of 120 mm but without the quartz ceramic lining applied on the reactor wall), and about 1850 kW with final rods diameter of about 150 mm.

The table in FIG. 4 gives additional examples for the polysilicon production using the disclosed apparatus and system having the quartz ceramic lining, as compared with data obtained with the apparatus and system having no such lining. The data for these examples are obtained by performing simulations using Flow Simulation a module for thermodynamic analysis) of SolidWorks® 2010 x64 Edition. These results demonstrate the improved energy efficiency and production capacity with the disclosed subject matter.

While the present application is described herein in terms of certain exemplary embodiments, those skilled in the art will recognize that various modifications and improvements can be made to the disclosed subject matter without departing from the scope thereof. Thus, it is intended that the present application include modifications and improvements that are within the scope of the appended claims. Moreover, although individual features of one embodiment of the application may be discussed herein and not in other embodiments, it should be apparent that individual features of one embodiment can be combined with one or more features of another embodiment or features from a plurality of embodiments.

In addition to the specific embodiments claimed below, the application is also directed to other embodiments having any other possible combination of the dependent features claimed below and those claimed above. As such, the particular features presented in the dependent claims and disclosed above can be combined with each other in other manners within the scope of the application such that the application should be recognized as also specifically directed to other embodiments having any other combinations. Thus, the foregoing description of specific embodiments of the application has been presented for purposes of illustration and description. It is not intended to be exhaustive or to limit the application to those embodiments disclosed.

What is claimed is:

1. An apparatus configured to produce polysilicon by chemical vapor deposition, comprising:
   a reactor vessel having an inner surface defining at least a portion of a chamber, the inner surface having a lining of quartz ceramic, the lining being defined by panels; and
   a silicon substrate disposed within the chamber of the reactor vessel, the silicon substrate having a deposition surface upon which polysilicon is deposited.

2. The apparatus of claim 1, wherein the lining of the quartz ceramic has a thickness of about 10 to 60 mm.

3. The apparatus of claim 1, wherein the reactor vessel has an overall cross dimension of from about 1000 to about 5000 mm.

4. The apparatus of claim 1, wherein the lining of the quartz ceramic has a thickness selected to maintain a temperature of the inner surface of the reactor within the range of between about 600° C. and about 900° C. during operation of the reactor vessel for production of polysilicon by chemical vapor deposition.

5. The apparatus of claim 1, wherein the lining includes quartz particles having an average diameter of from about 50 nanometers to about 300 micrometers.

6. The apparatus of claim 1, wherein the lining includes quartz particles having a purity of SiO2 of about 99.99% or greater.

7. The apparatus of claim 1, wherein the lining includes quartz particles having a porosity of from about 1% to about 90%.

8. The apparatus of claim 1, wherein the lining includes fused crushed SiO2 or spheroidized microgranules SiO2.

9. The apparatus of claim 1, wherein the lining comprises one of the group of amorphous silica, crystalline silica, and mixtures thereof.

10. The apparatus of claim 1, wherein the silicon substrate comprises a silicon rod.

11. The apparatus of claim 9, wherein the silicon rod has an initial cross-sectional dimension of from about 5 mm to about 15 mm.

12. A method of producing polysilicon using a reactor vessel having an inner surface defining at least a portion of a chamber, and a silicon substrate disposed within the chamber, the method comprising:
   applying a lining of quartz ceramic to the inner surface of the reactor vessel, the lining being defined by panels; and
   introducing at least one reactant gas for chemical vapor deposition into the reactor vessel to contact the silicon substrate at a suitable reaction temperature to produce polysilicon by reaction of the reactant gases, the polysilicon being deposited on the silicon substrate.

13. The method of claim 12, further comprising heating the silicon substrate to the suitable reaction temperature.

14. The method of claim 12, wherein the suitable temperature is about 1000° C. to about 1100° C.

15. The method of claim 12, wherein the silicon substrate comprises a silicon rod.

16. The method of claim 15, wherein the deposited polysilicon grows on the silicon rod to form a rod having a diameter of about 120 mm to about 150 mm.

17. The method of claim 12, further comprising: maintaining the temperature of the internal surface of the reactor vessel at about 600° C. to 900° C.

18. The method of claim 12, wherein the at least one reactant gas comprises silane or a chloro-substituted silane.

19. The method of claim 12, wherein the at least one reactant gas comprises trichlorosilane.

20. A method of improving an existing reactor vessel configured for the production of polysilicon by chemical vapor deposition, comprising:
   providing a reactor vessel having an inner surface defining at least a portion of a chamber; and
   applying a lining of quartz ceramic to the inner surface of the reactor vessel, the lining being defined by panels.

21. The method of claim 20, wherein inner surface of the reactor vessel is made of stainless steel.

22. The method of claim 20, wherein applying further comprises:
forming one or more sections of the lining; and
attaching the one or more sections of the lining to the inner surface of the reactor vessel.

23. The method of claim 22, wherein forming comprises:
obtaining raw quartz particles;
milling the raw quartz particles;
forming an aqueous slip of the milled quartz particles; and
molding of the slip of the milled quartz particles into sections or panels.

24. The method of claim 22, wherein attaching comprises using one or more latch elements.

25. The method of claim 22, wherein attaching comprises using glue.

26. The apparatus of claim 1, wherein the lining of the quartz ceramic is configured to prevent or inhibit heat loss to provide a reaction temperature within a range of between about 1000° C. and about 1100° C. of a reactant gas during operation of the reactor vessel for production of polysilicon by chemical vapor deposition.

27. The apparatus of claim 26, wherein the reactant gas is trichlorosilane.

* * * * *